United States Patent
Mellein

(10) Patent No.: US 10,404,384 B1
(45) Date of Patent: Sep. 3, 2019

(54) SYSTEM AND METHOD FOR TESTING A DEVICE UNDER TEST WITHIN AN ANECHOIC CHAMBER BASED ON A MINIMUM TEST CRITERIA

(71) Applicant: Rohde & Schwarz GmbH & Co. KG, Munich (DE)

(72) Inventor: Heinz Mellein, Haar (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/054,234

(22) Filed: Aug. 3, 2018

(51) Int. Cl.
*H04B 17/00* (2015.01)
*H04W 24/06* (2009.01)
*G01R 29/08* (2006.01)
*G01R 31/00* (2006.01)

(52) U.S. Cl.
CPC ..... *H04B 17/0085* (2013.01); *G01R 29/0821* (2013.01); *H04W 24/06* (2013.01); *G01R 29/0835* (2013.01); *G01R 31/001* (2013.01)

(58) Field of Classification Search
CPC ........ G01R 29/0821; G01R 29/0835; G01R 29/10; G01R 29/105; G01R 31/001; H04B 17/0085; H04B 7/0617; H04B 7/10; H04W 24/06
See application file for complete search history.

(56) References Cited

U.S. PATENT DOCUMENTS

| | | | | |
|---|---|---|---|---|
| 5,604,751 A * | 2/1997 | Panis | ...... | G01R 29/02 714/724 |
| 6,256,759 B1 * | 7/2001 | Bhawmik | ...... | G01R 31/318591 714/726 |
| 6,771,175 B1 * | 8/2004 | Eagle | ...... | B60R 21/01516 280/733 |
| 8,971,821 B2 * | 3/2015 | Schlub | ...... | G01R 29/0857 455/67.12 |
| 9,094,056 B2 * | 7/2015 | Ouyang | ...... | H04B 17/373 |
| 9,613,465 B1 * | 4/2017 | Tsai | ...... | G01B 11/303 |
| 9,614,627 B2 * | 4/2017 | Yu | ...... | H04B 17/0085 |
| 9,991,591 B1 * | 6/2018 | Rowell | ...... | H01Q 3/267 |
| 9,991,592 B1 * | 6/2018 | Rowell | ...... | H01Q 3/267 |
| 10,044,104 B1 * | 8/2018 | Bartko | ...... | H01Q 3/267 |
| 2001/0013572 A1 * | 8/2001 | Kuderer | ...... | G01J 1/08 250/208.2 |
| 2004/0066913 A1 * | 4/2004 | Kennedy | ...... | H04M 3/301 379/22 |
| 2005/0176375 A1 * | 8/2005 | Bednasz | ...... | G01R 29/10 455/67.12 |
| 2006/0017630 A1 * | 1/2006 | Kildal | ...... | G01R 29/0821 343/703 |
| 2006/0194553 A1 * | 8/2006 | Ozaki | ...... | G01R 29/10 455/226.1 |
| 2007/0164755 A1 * | 7/2007 | Stojcevic | ...... | G01R 29/105 324/627 |
| 2007/0207756 A1 * | 9/2007 | Qi | ...... | H04B 17/20 455/226.1 |

(Continued)

*Primary Examiner* — Devan A Sandiford
(74) *Attorney, Agent, or Firm* — Christensen O'Connor Johnson Kindness PLLC

(57) ABSTRACT

A method for testing a device under test with regard to spherical coverage is described, wherein a device under test is placed in an anechoic space to which a measurement antenna is assigned. A spherical coverage test is performed. The spherical coverage test is stopped after a minimum test criteria has been fulfilled. Further, a test system is described.

17 Claims, 2 Drawing Sheets

(56) References Cited

U.S. PATENT DOCUMENTS

| | | | | |
|---|---|---|---|---|
| 2008/0102897 A1* | 5/2008 | Song | G01R 27/06 | 455/562.1 |
| 2008/0129615 A1* | 6/2008 | Breit | G01R 29/105 | 343/703 |
| 2008/0311871 A1* | 12/2008 | Qi | H04B 17/29 | 455/226.2 |
| 2009/0000136 A1* | 1/2009 | Crampton | B25J 13/088 | 33/503 |
| 2009/0284425 A1* | 11/2009 | Snow | G01R 29/10 | 343/703 |
| 2009/0295405 A1* | 12/2009 | Pommerenke | G01R 29/0878 | 324/627 |
| 2009/0318103 A1* | 12/2009 | Feenaghty | H04B 17/29 | 455/226.3 |
| 2010/0045543 A1* | 2/2010 | Kitada | G01R 29/105 | 343/703 |
| 2010/0156896 A1* | 6/2010 | Ichimura | G01B 11/245 | 345/419 |
| 2010/0171669 A1* | 7/2010 | Ito | G01R 29/10 | 343/703 |
| 2011/0095950 A1* | 4/2011 | Yu | H04W 24/06 | 343/703 |
| 2011/0145653 A1* | 6/2011 | Broadfoot | G06F 11/3604 | 714/38.1 |
| 2013/0093447 A1* | 4/2013 | Nickel | H04W 24/06 | 324/750.16 |
| 2014/0087668 A1* | 3/2014 | Mow | H04B 17/318 | 455/67.14 |
| 2014/0226167 A1* | 8/2014 | Smith | G03B 21/14 | 356/614 |
| 2014/0256267 A1* | 9/2014 | Chien | G01R 29/105 | 455/67.12 |
| 2014/0267624 A1* | 9/2014 | Hara | G01B 11/2504 | 348/46 |
| 2014/0307568 A1* | 10/2014 | Zhang | H04B 7/0689 | 370/252 |
| 2015/0146215 A1* | 5/2015 | Kobayashi | G01B 11/2504 | 356/610 |
| 2015/0177301 A1* | 6/2015 | Kajbaf | G01R 29/0892 | 324/892 |
| 2016/0359573 A1* | 12/2016 | Pauly | H04B 17/12 | |
| 2017/0068771 A1* | 3/2017 | Muchaidze | G06F 17/5081 | |
| 2017/0223559 A1* | 8/2017 | Kong | H04W 24/06 | |
| 2017/0276471 A1* | 9/2017 | Jiang | G01B 9/02004 | |
| 2017/0338550 A1* | 11/2017 | Alon | H04B 17/102 | |
| 2017/0339335 A1* | 11/2017 | Kuokkanen | H04N 5/23216 | |
| 2018/0027434 A1* | 1/2018 | Foegelle | H04B 7/0617 | 455/67.13 |
| 2018/0041289 A1* | 2/2018 | Pabst | H04B 17/103 | |
| 2018/0088162 A1* | 3/2018 | Ndip | H04B 17/27 | |
| 2018/0205821 A1* | 7/2018 | Rowell | H04M 3/28 | |
| 2018/0287721 A1* | 10/2018 | Vikstedt | G01R 29/0814 | |

* cited by examiner

SYSTEM AND METHOD FOR TESTING A DEVICE UNDER TEST WITHIN AN ANECHOIC CHAMBER BASED ON A MINIMUM TEST CRITERIA

FIELD OF THE DISCLOSURE

Embodiments of the present disclosure relate generally to a method for testing a device under test with regard to spherical coverage. Further, embodiments of the present disclosure relate generally to a test system for testing a device under test with regard to spherical coverage.

BACKGROUND

In the state of the art, it is known to test a device under test with regard to its spherical coverage while using a test system that covers the entire sphere surrounding the device under test. During the respective testing of the device under test, several measurement samples are gathered which have to be analyzed later for evaluating the spherical behavior of the device under test. Thus, a statistical post-analysis is applied for the results retrieved by the spherical coverage test.

Generally, the spherical coverage tests may be done by different methodologies which can be classified into a so-called conical cut test method and a so-called great circle cut test method which differ in the respective scanning methods. In both methods, however, several measurement samples are gathered so as to cover the entire sphere or rather the full sphere surrounding the device under test.

However, the high number of measurement samples to be gathered results in long measurement periods for testing the device under test with regard to spherical coverage.

Accordingly, there is a need for a method as well as test system which are enabled to perform the testing of the device under test with regard to spherical coverage in a faster manner.

SUMMARY

Embodiments of the present disclosure provide a method for testing a device under test with regard to spherical coverage, comprising the following steps:
placing a device under test in an anechoic space to which at least one measurement antenna is assigned;
performing a spherical coverage test; and
stopping the spherical coverage test after a minimum test criteria has been fulfilled.

Moreover, embodiments of the present disclosure provide a test system for testing a device under test with regard to spherical coverage comprising an anechoic space, at least one measurement antenna placed within the anechoic space, a positioner for holding the device under test, and a control and evaluation unit that is connected to at least one of the measurement antenna and the positioner. The control and evaluation unit is configured to stop the spherical coverage test after a minimum test criteria has been fulfilled.

Accordingly, the measurement time or rather the measurement period can be minimized since the spherical coverage test is (automatically) stopped once the predefined test criteria has been fulfilled. Therefore, it is not necessary to measure the full sphere of the device under test during the spherical coverage test and to perform a statistical post-analysis which would take only a few measurement samples into account.

In some embodiments, the testing according to the present disclosure is based on a certain percentile requirement wherein the percentile is a measure used in statistics that indicate the value below which a given percentage of measurement samples may be found. In other words, the spherical coverage test is stopped once a predefined confidence criteria that is assigned to the minimum test criteria has been fulfilled.

According to an aspect, at least one of the device under test and the measurement antenna is moved during the spherical coverage test. The control and evaluation unit may be configured to control movement of at least one of the positioner and the measurement antenna during a spherical coverage test. Hence, the device under test held by the positioner and/or the measurement antenna may be moved during the spherical coverage test so as to record measurement samples appropriately. In fact, the device under test is moved by the positioner that holds the device under test during the spherical coverage test wherein the positioner is controlled appropriately.

Generally, the control evaluation and unit controls the movement of the positioner and/or the measurement antenna.

Another aspect provides that the spherical coverage test is performed by using at least one of a conical cut environment and a great circle cut environment. The respective cut environments relate to different types of testing methodologies, for example with regard to the moved component. The positioner is established to as to correspond to at least one of the conical cut environment and the great circle cut environment. Hence, the respective movability of the positioner may be different due to the respective cut environments.

In a conical cut environment, the positioner is only rotated in the azimuth direction since the conical cut environment comprises several fixed measurement antennas, also called probes, which are assigned to the full sphere surrounding the device under test. The measurement antennas or rather probes are typically fixed to a fixation component, for instance an arc. Alternatively, a single measurement antenna is provided in the conical cut environment wherein the respective measurement antenna is movable along structure, for instance an arc.

In a great circle cut environment, the positioner is rotated in the azimuth direction and in the roll direction whereas a fixed measurement antenna is provided. Accordingly, the test setup is simplified with regard to the measurement antenna(s) compared to the conical cut environment.

However, the conical cut environment is advantageous with regard to heavier devices under test as no rotation in the roll direction is required.

Generally, the conical cut environment may relate to movement of the measurement antenna as well as the device under test in one orientation, namely the azimuth direction, during spherical coverage test whereas the great circle cut environment relates to a fixed measurement antenna while the device under test is moved in different orientations, namely the azimuth direction and the roll direction.

Furthermore, the minimum test criteria may correspond to a minimum number of measurement samples exceeding a predefined limit. Hence, the spherical coverage test is stopped once a predefined number of measurement samples, namely the minimum number, exceeds the predefined limit which are sufficient for analysis. Therefore, the testing time can be reduced appropriately as no further measurement samples have to be gathered than the ones being sufficient according to the minimum test criteria defined.

Generally, the minimum test criteria may be set previously, for instance by a customer, an operator of the test system or another authority.

For instance, the predefined limit is a minimum equivalent isotropically radiated power (EIRP). The minimum EIRP may be 10 dBm. Accordingly, the measurement samples have to exceed the predefined limit, namely the minimum EIRP, which may also be set previously. Only the measurement samples exceeding the minimum EIRP can be used for evaluation.

The minimum number and/or the predefined limit may be set previously. As the minimum test criteria may be set previously, the respective parameters defining the minimum test criteria can also be set in advance, for instance by a customer, an operator of the test system or another authority Once enough measurement samples, namely more than the minimum number, are gathered which exceed this minimum EIRP, the spherical coverage test is stopped.

The respective minimum number may also be set previously, for instance by a customer, an operator of the test system or another authority.

Moreover, the control evaluation unit may have a memory in which the minimum test criteria is stored. The minimum test criteria may be entered via a user interface.

Furthermore, the measurement samples may correspond to spherical measurement samples. Accordingly, the spherical coverage test provides several measurement samples for evaluation purposes that are assigned to a full sphere surrounding the device under test.

In some embodiments, the measurement samples are randomly selected within a given spherical measurement grid. Thus, a certain number of measurement samples are randomly selected from the measurement samples obtained.

Alternatively, the measurement samples are gathered at randomly selected measurement points that relate to a given spherical measurement grid. Hence, the measurement antenna and/or the device under test, for example the positioner holding the device under test, are controlled appropriately so that the selected measurement points assigned to the spherical measurement grid are reached. Once these measurement points are reached, the respective measurement is performed.

For example, only certain measurement antennas of the plurality of measurement antennas assigned to the conical cut environment are used wherein these certain measurement antennas are randomly selected from the spherical measurement grid provided by all measurement antennas in the conical cut environment. For instance, the control and evaluation unit may control the different measurement antennas appropriately.

Generally, the device under test may be at least one of a base station and a user end device. The base station and the user end device may communicate with each other so that it is necessary to obtain information with regard to the spherical coverage of both communication partners as the respective signals are transmitted in all directions.

In some embodiments, the user end device is a cell phone or a portable computing device generally referred to in the art as a tablet. A cell phone as well as a tablet are typically equipped with antenna units so that the respective characteristics shall be measured in order to obtain information with regard to their over-the-air (OTA) characteristics, for example the spherical coverage.

Furthermore, measurement antenna may be located within the anechoic space. Thus, the device under test as well as the measurement antenna are located within the anechoic space so that any disturbing signals may be prevented which might disturb the measurement results.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
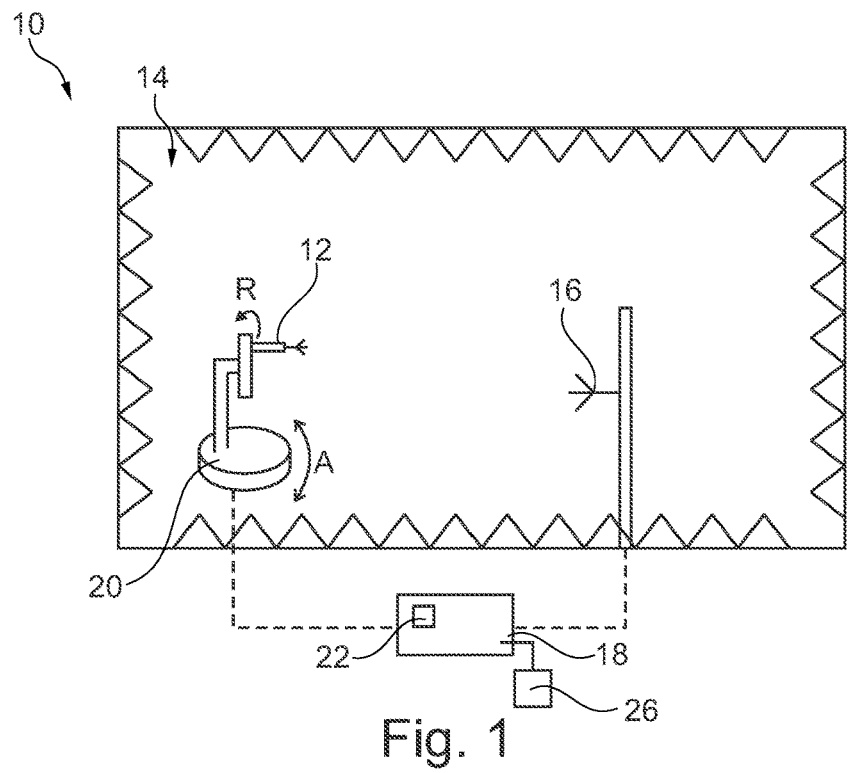
FIG. 1 schematically shows an overview of a representative test system according to the present disclosure.

In FIG. 1 a test system 10 for testing a device under test 12 with regard to spherical coverage is shown wherein the test system 10 shown is assigned to a great circle cut environment. The test system 10 comprises an anechoic space 14 which may be established by an anechoic chamber, an anechoic room or any other suitable space for testing the device under test 12 without any disturbing interferences.

The device under test 12 has at least one antenna for receiving and/or transmitting electromagnetic signals. For testing purposes, the device under test 12 is placed within the anechoic space 14 as well as at least one measurement antenna 16. In the shown embodiment, the at least one measurement antenna 16 is fixedly positioned within the anechoic space 14. For instance, the at least one measurement antenna 16 is mounted at a bar.

The test system 10 also comprises a control and evaluation unit 18 that may be connected with the measurement antenna 16 and configured to control the measurement antenna 16, for example the signals emitted by the measurement antenna 16, and/or receiving the respective signals received by the measurement antenna 16. In some embodiments, the control and evaluation unit 18 may also be connected with the device under test 12 so as to control the device under test 12, for example the signals emitted by the device under test 12, and/or to receive the respective signals received by the device under test 12. Depending on the test scenario, the transmission properties or the receiving properties of the device under test 12 are tested appropriately wherein the control and evaluation unit 18 controls the device under test 12 and the measurement antenna 16 appropriately.

The control and evaluation unit 18 may include, in some embodiments, logic for implementing the technologies and methodologies described herein. This logic of the control and evaluation unit 18 can be carried out in either hardware or software, or a combination of hardware and software. In some embodiments, the control and evaluation unit 18 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control and evaluation unit 18 includes a microprocessor and a memory storing logic modules and/or instructions. In an embodiment, the control and evaluation unit 18 includes one or more ASICs having a plurality of predefined logic components. In an embodiment, the control and evaluation unit 18 includes one or more FPGA having a plurality of programmable logic components. In an embodiment, the control and evaluation unit 18 includes hardware circuit implementations (e.g., implementations in analog circuitry, implementations in digital circuitry, and the like, and combinations thereof). In an embodiment, the control and evaluation unit 18 includes combinations of circuits and computer program products having software or firmware instructions stored on one or more computer readable memories that work together to cause a device to perform one or more methodologies or technologies described herein.

The test system 10 in some embodiments comprises a positioner 20 that holds the device under test 12 during the spherical coverage test. In these embodiments, the control evaluation unit 18 is also configured to control at least the movement of the positioner 20 during the spherical coverage test. In some embodiments, the positioner includes, for example, a multiple axis rotation table comprising controllable electric motors (not shown) for each rotation axis. Other configurations of the positioner 20 can also be employed to carry out the functionality herein described.

In the shown embodiment, the test system 10 comprises a great circle cut environment so that the positioner 20 may be moved in a rotational direction which movement is controlled by the control and evaluation unit 18.

The positioner 20 is configured to perform rotational movements in the azimuth direction A and in the roll direction R as indicated in FIG. 1.

Hence, a spherical coverage of the device under test 12 can be tested since the device under test 12 is moved appropriately so that several measurement samples can be taken during a testing scenario.

In addition, the control and evaluation unit 18 may have a memory 22 in which a minimum test criteria is stored that is used for controlling the spherical coverage test of the device under test 12, for example stopping the spherical coverage test. The minimum test criteria stored in the memory 22 relates to a minimum number of measurement samples that exceed a predefined limit.

In some embodiments, the predefined limit may be a minimum equivalent isotropically radiated power (EIRP), for instance 10 dBm. The minimum test criteria may be set previously, for example the minimum number as well as the predefined limit.

Figure 4:
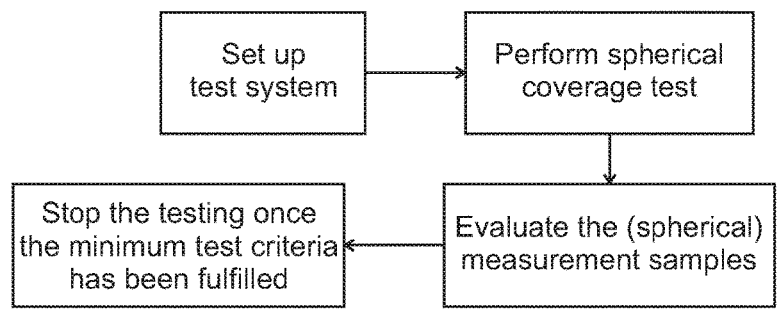
FIG. 4 schematically shows a flow-chart illustrating a representative method according to the present disclosure.

Once the minimum test criteria that is stored in the memory 22 has been fulfilled during the spherical coverage test, the control and evaluation unit 18 stops the spherical coverage test directly a will be described later with regard to FIG. 4.

Figure 2:
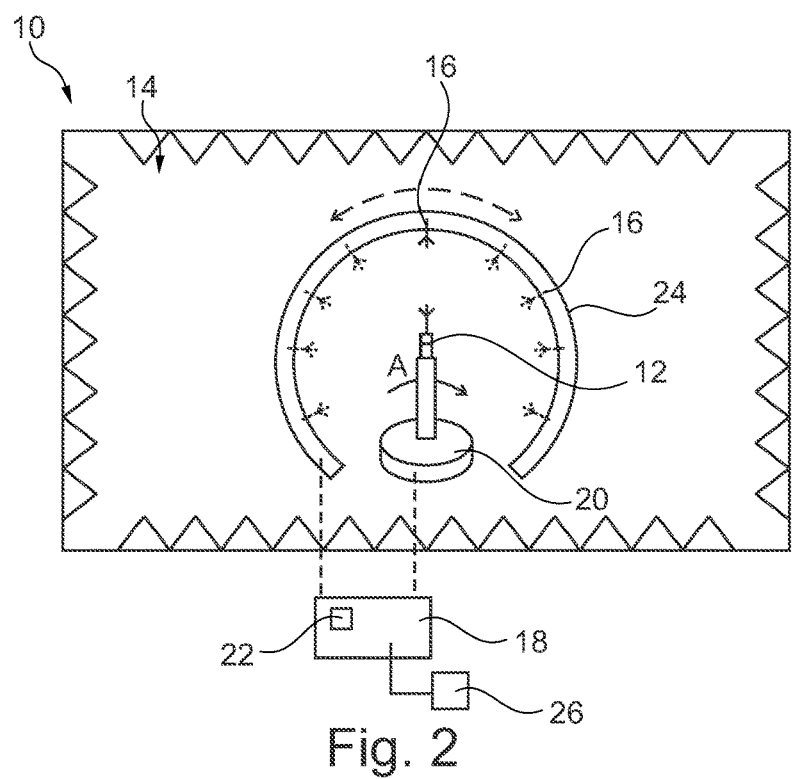
FIG. 2 schematically shows another overview of a representative test system according to the present disclosure.

FIG. 2 schematically illustrates another representative test system 10. The test system 10 relates to a conical cut environment wherein the differences to the test system 10 relating to the great circle cut environment are discussed. As shown in FIG. 2, the test system 10 may comprise several measurement antennas 16 that are held by an antenna holder or rather a fixation component 24. The several measurement antennas 16 are assigned to a sphere that surrounds the device under test 12 which is placed on the positioner 20.

In the conical cut environment, the positioner 20 is configured to perform only rotational movements in the azimuth direction A as indicated in FIG. 2. In some embodiments, the positioner includes, for example, a single axis rotation table comprising a controllable electric motor (not shown). Other configurations of the positioner 20 can also be employed to carry out the functionality herein described.

However, the several measurement antennas 16, also called probes, ensure that a spherical coverage test can be performed as several measurement samples are taken when the device under test 12 emits electromagnetic waves. Alternatively, the test system 10 according to the conical cut environment comprises only one measurement antenna 14 that is movable along the antenna holder or rather the fixation component 24 as indicated by the dashed arrow. This also ensures that several measurement samples may be gathered which ensure a spherical coverage test of the device under test 12.

Accordingly, the test system 10 according to the different environments distinguish from each other with regard to the movement(s) of the components, for example the movements of the positioner 20 and, therefore, the ones of the device under test 12 held by the positioner 20.

Generally, the control and evaluation unit 18 is configured to control the movement of the measurement antenna 16 and/or the movement of the positioner 20 and, therefore, the movement of the device under test 12.

Hereinafter, a method for testing the device under test 12 according to the present disclosure is discussed while referring to FIGS. 1, 3, and 4. In a first step S1, the test system 10 is set up. For example, the device under test 12 is placed into the anechoic space 14. In some embodiments, the device under test 12 is mounted to the positioner 20. Further, the at least one measurement antenna 14 is placed into the anechoic space 14 if necessary.

Then, the spherical coverage test is performed S2. During the spherical coverage test, several measurement samples, for example spherical measurement samples, are gathered by the control and evaluation unit 18 via the measurement antenna 14 and/or the device under test 12. For doing so, the control and evaluation unit 18 controls the movement of the positioner 20 and/or the measurement antenna 14 depending on the specific embodiment as explained above.

The control and evaluation unit 18 evaluates the (spherical) measurement samples gathered during the spherical coverage test (Step S3) wherein the control and evaluation unit 18 stops the testing once the minimum test criteria has been fulfilled (Step S4) that is stored in the memory 22. As already mentioned, the minimum test criteria relates to a minimum number of measurement samples that exceed a predefined limit.

Figure 3:
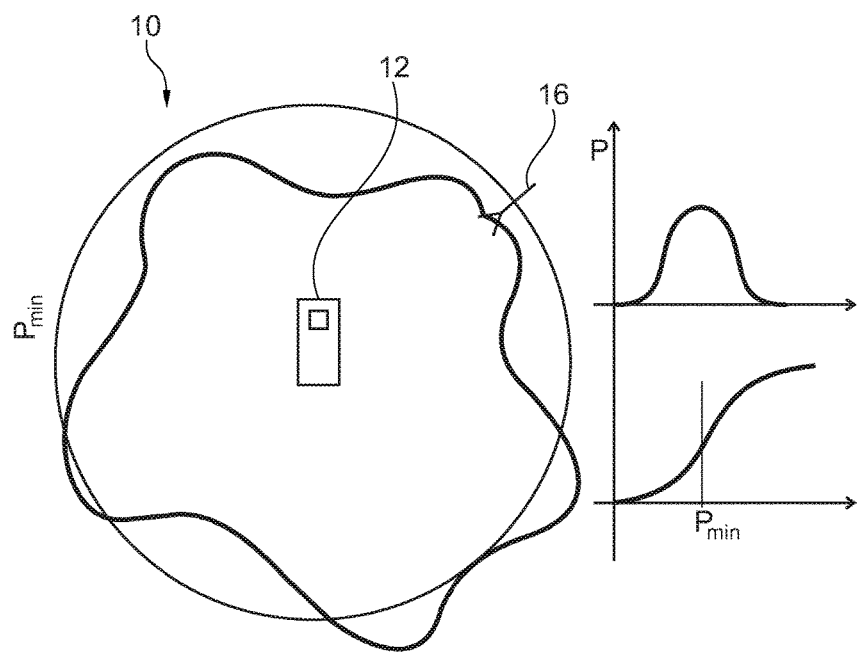
FIG. 3 schematically shows an overview illustrating the measurement concept.

In FIG. 3, it is shown that different measurement samples are gathered during the testing which relate to different equivalent isotropically radiated powers (left side of FIG. 3). On the right side of FIG. 3, diagrams illustrating the distribution of the equivalent isotropically radiated powers gathered by the different measurement samples. The predefined limit $P_{min}$ is indicated appropriately which may relate to an equivalent isotropically radiated power of 10 dBm.

For instance, the minimum number may relate to a percentile of 50% so that the minimum test criteria is fulfilled when the minimum number of measurement samples that exceed the predefined limit of 10 dBm relates to a percentile of 50%.

The respective measurement samples may be selected randomly within a given spherical measurement grid for evaluation purposes.

The given spherical measurement grid may correspond to the several (spherical) positions that can be reached by the test system 10 due to the movement(s) of the components of the test system 10. Alternatively, the given spherical measurement grid may relate to the positions of the several measurement antennas 16 according to the conical cut environment shown in FIG. 2.

Accordingly, the measurement time for spherical coverage tests can be reduced significantly since it is no more necessary that the full sphere has to be measured as it is sufficient that the predefined minimum test criteria has been fulfilled so that the spherical coverage test can be stopped earlier.

Further, the measurement samples that are used for testing the device under test 12 may have been selected previously from a given spherical measurement grid assigned to the device under test 12.

The selected measurement points may be addressed appropriately while controlling the movement of the device under test 12, for example via the positioner 20, and/or the measurement antenna 16.

Alternatively or additionally several measurement samples have been recorded wherein a certain number of these measurement samples are randomly selected by the control and evaluation unit 18 within the given spherical measurement grid for evaluation purposes.

In general, the device under test 12 may be a base station or a user end device such as a cell phone or a tablet. Hence, the typical communication partners for over-the-air communication (OTA communication) may be tested by the method for testing a device under test 12 with regard to spherical coverage as well as the dedicated test system 10.

Generally, the testing time can be reduced significantly since the spherical coverage test is stopped automatically by the control and evaluation unit 18 as soon as the (predefined) minimum test criteria is reached.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for testing a device under test with regard to spherical coverage, comprising the following steps:
    placing a device under test in an anechoic space to which at least one measurement antenna is assigned;
    performing a spherical coverage test; and
    stopping the spherical coverage test after a minimum test criteria has been fulfilled, wherein the minimum test criteria corresponds to a minimum number of measurement samples exceeding a predefined limit, and wherein the predefined limit is a minimum equivalent isotropically radiated power or the measurement samples are randomly selected within a given spherical measurement grid.

2. The method according to claim 1, wherein at least one of the device under test and the measurement antenna is moved during the spherical coverage test.

3. The method according to claim 1, wherein the spherical coverage test is performed by using at least one of a conical cut environment and a great circle cut environment.

4. The method according to claim 1, wherein the predefined limit is a minimum equivalent isotropically radiated power and the measurement samples are randomly selected within a given spherical measurement grid.

5. The method according to claim 1, wherein at least one of the minimum number and the predefined limit is set previously.

6. The method according to claim 1, wherein the measurement samples correspond to spherical measurement samples.

7. The method according to claim 1, wherein the measurement samples are randomly selected within a given spherical measurement grid and the predefined limit is a minimum equivalent isotropically radiated power.

8. The method according to claim 1, wherein the device under test is at least one of a base station and a user end device.

9. The method according to claim 1, wherein the measurement antenna is located within the anechoic space.

10. A test system for testing a device under test with regard to spherical coverage, comprising:
    an anechoic space;
    at least one measurement antenna placed within the anechoic space;
    a positioner configured to hold the device under test; and
    a control and evaluation unit that is connected to at least one of the measurement antenna and the positioner, the control and evaluation unit being configured to stop the spherical coverage test after a minimum test criteria has been fulfilled, wherein the minimum test criteria is assigned to a minimum number of measurement samples exceeding a predefined limit, and wherein the predefined limit is a minimum equivalent isotropically radiated power or the measurement samples are randomly selected within a given spherical measurement grid.

11. The test system according to claim 10, wherein the control and evaluation unit is configured to control movement of at least one of the positioner and the measurement antenna during a spherical coverage test.

12. The test system according to claim 10, wherein the positioner corresponds to at least one of a conical cut environment and a great circle cut environment.

13. The test system according to claim 10, wherein the control and evaluation unit has a memory in which the minimum test criteria is stored.

14. The test system according to claim 10, wherein the predefined limit is a minimum equivalent isotropically radiated power and the measurement samples are randomly selected within a given spherical measurement grid.

15. The test system according to claim 10, wherein the measurement samples correspond to spherical measurement samples.

16. The test system according to claim 10, wherein the measurement samples are randomly selected within a given spherical measurement grid and the predefined limit is a minimum equivalent isotropically radiated power.

17. The test system according to claim 10, wherein the device under test is a base station or a user end device.

* * * * *